US009047065B2

(12) United States Patent
Yang

(10) Patent No.: US 9,047,065 B2
(45) Date of Patent: Jun. 2, 2015

(54) COMPUTER CASE AND COOLING DEVICE THEREOF

(71) Applicant: GIGA-BYTE TECHNOLOGY CO., LTD., New Taipei (TW)

(72) Inventor: Jia Lin Yang, New Taipei (TW)

(73) Assignee: GIGA-BYTE TECHNOLOGY CO., LTD., NEW TAIPEI (TW)

( * ) Notice: Subject to any disclaimer, the term of this patent is extended or adjusted under 35 U.S.C. 154(b) by 301 days.

(21) Appl. No.: 13/762,389

(22) Filed: Feb. 8, 2013

(65) Prior Publication Data

US 2014/0225490 A1    Aug. 14, 2014

(51) Int. Cl.
G06F 1/20       (2006.01)
H05K 5/00      (2006.01)
H05K 7/20      (2006.01)

(52) U.S. Cl.
CPC .............. G06F 1/20 (2013.01); H05K 7/2019 (2013.01)

(58) Field of Classification Search
CPC ............ G06F 1/20; G06F 1/206; H05K 7/20; H05K 7/20172; H05K 7/20181; H05K 7/2019; H05K 7/20209
USPC .............................. 361/679.46, 679.48, 679.6
See application file for complete search history.

(56) References Cited

U.S. PATENT DOCUMENTS

| 3,410,328 | A | * | 11/1968 | Hideo Sasai | 220/9.2 |
| 5,721,670 | A | * | 2/1998 | Cochrane et al. | 361/695 |
| 5,991,150 | A | * | 11/1999 | Chiu et al. | 361/679.05 |
| 6,053,590 | A | * | 4/2000 | Chang | 312/284 |
| 6,532,147 | B1 | * | 3/2003 | Christ, Jr. | 361/679.27 |
| 2013/0206753 | A1 | * | 8/2013 | Zhang et al. | 220/9.2 |
| 2014/0118926 | A1 | * | 5/2014 | Santos | 361/679.48 |

* cited by examiner

*Primary Examiner* — Anthony Haughton
(74) *Attorney, Agent, or Firm* — Chun-Ming Shih

(57) ABSTRACT

A computer case includes a housing and a cooling device. The cooling device includes a first pillar, a second pillar, a movable element, and a heat-dissipating element. The first pillar penetrates a top guidance slot hole and a bottom guidance slot hole of the housing and has an elongated slot hole; the second pillar penetrates a first side guidance slot hole, a second side guidance slot hole, and the elongated slot hole and forms an intersection portion of the first and the second pillar. The movable element is disposed in the intersection portion, and a heat-dissipating element is fixed to the movable element. When the first pillar moves along a first direction and/or the second pillar moves along a second direction, the movable element drives the heat-dissipating element to move along the first direction and/or the second direction, so as to adjust the position of the heat-dissipating element.

10 Claims, 9 Drawing Sheets

COMPUTER CASE AND COOLING DEVICE THEREOF

BACKGROUND

1. Technical Field

This disclosure relates to a computer case and a cooling device thereof, and more particularly to the computer case and the cooling device thereof which can adjust according to cooling needs.

2. Related Art

In a computer system, in order to avoid overheating of computer components during operation, cooling devices are set up at the heat source. For example, fans are set up to a central processing unit, a video card, or a power supply, so as to ease the problem of overheating.

However, with computer components with high performance, the heat generated by these computer components is increased. Though the cooling effect of the cooling devices increases as well, the accumulated heat in the computer case can not be exhausted by the fans set up to the central processing unit, the video card, or the power supply. Therefore, system fans are set up in the computer case as well, so as to enhance airflow in the computer case. However, these system fans are fixed, so these system fans can not target a specific heat source to enhance the heat dissipating efficiency.

SUMMARY OF THIS DISCLOSURE

In view of the above problem, this disclosure provides a computer case and a cooling device thereof to solve the problem that the cooling effect of cooling devices in the prior art is not enough for computer components in a computer case and that the positions of the cooling devices can not be adjusted according to cooling needs.

The computer case of this disclosure includes a housing and a cooling device. The housing includes a top surface, a first side surface, a second side surface, and a bottom surface. The top surface has a top guidance slot hole; the first side surface has a first side guidance slot hole; the second side surface has a second side guidance slot hole; the bottom surface has a bottom guidance slot hole. The first side surface and the second side surface are connected with the top surface and the bottom surface. The cooling device includes a first pillar, a second pillar, a movable element, and a heat-dissipating element. The first pillar penetrates the top guidance slot hole and the bottom guidance slot hole and has an elongated slot hole communicating two sides thereof. The second pillar penetrates the first side guidance slot hole, the second side guidance slot hole, and the elongated slot hole and forms an intersection portion in the intersection of the first and the second pillar. The movable element is disposed at the intersection portion. The heat-dissipating element is fixed to the movable element. When the first pillar moves along a first direction with respect to the top guidance slot hole and the bottom guidance slot hole and/or the second pillar moves along a second direction with respect to the first side guidance slot hole and the second side guidance slot hole, the movable element drives the heat-dissipating element to move along the first direction and/or the second direction.

Besides, this disclosure provides a cooling device, which applies to penetrate a housing. The housing includes a top surface, a first side surface, a second side surface, and a bottom surface. The top surface has a top guidance slot hole; the first side surface has a first side guidance slot hole; the second side surface has a second side guidance slot hole; the bottom surface has a bottom guidance slot hole. The first side surface and the second side surface are connected with the top surface and the bottom surface. The cooling device includes a first pillar, a second pillar, a movable element, and a heat-dissipating element. The first pillar penetrates the top guidance slot hole and the bottom guidance slot hole of the housing and has an elongated slot hole communicating two sides thereof. The second pillar penetrates the first side guidance slot hole and the second side guidance slot hole of the housing and the elongated slot hole in the first pillar and forms an intersection portion in the intersection of the first and the second pillar. The movable element is disposed at the intersection portion. The heat-dissipating element is fixed to the movable element. When the first pillar moves along a first direction with respect to the top guidance slot hole and the bottom guidance slot hole and/or the second pillar moves along a second direction with respect to the first side guidance slot hole and the second side guidance slot hole, the movable element drives the heat-dissipating element to move along the first direction and/or the second direction.

With the coordination of the first pillar and the second pillar, users can directly adjust the position of the heat-dissipating element without opening the housing, thus enhancing the cooling effect of the cooling device.

The detail of this disclosure can be better appreciated from the following detailed description of this disclosure, taken in conjunction with the attached drawings.

BRIEF DESCRIPTION OF THE DRAWINGS

This disclosure will become more fully understood from the detailed description given herein below for illustration only, and thus not limitative of this disclosure, wherein.

DETAILED DESCRIPTION OF THE DISCLOSURE

Figure 1A:
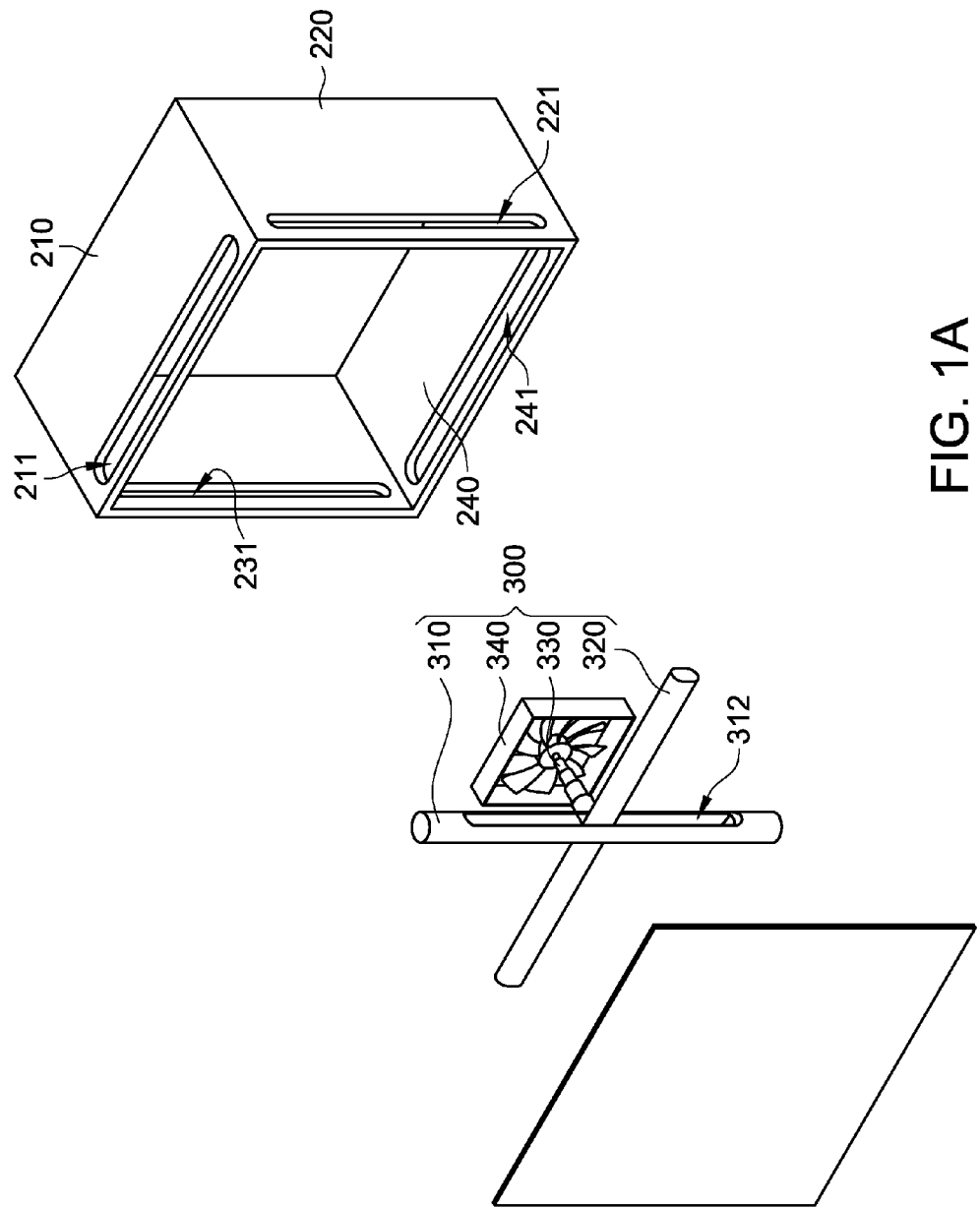
FIG. 1A is an exploded view of the computer case according to a first embodiment.
Figure 1B:
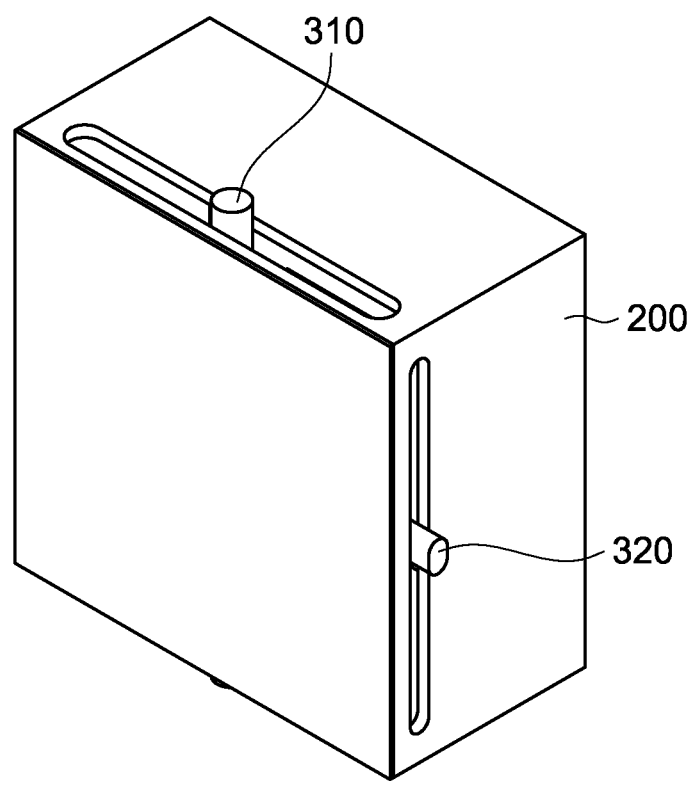
FIG. 1B is a perspective view of the computer case according to the first embodiment.
Figure 2A:
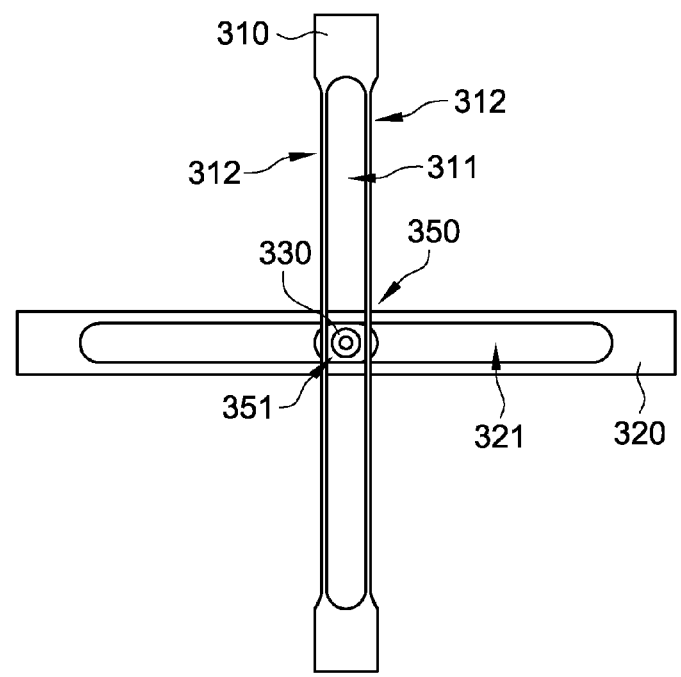
FIG. 2A is a view of the first pillar, the second pillar, and the movable element according to the first embodiment.
Figure 2B:
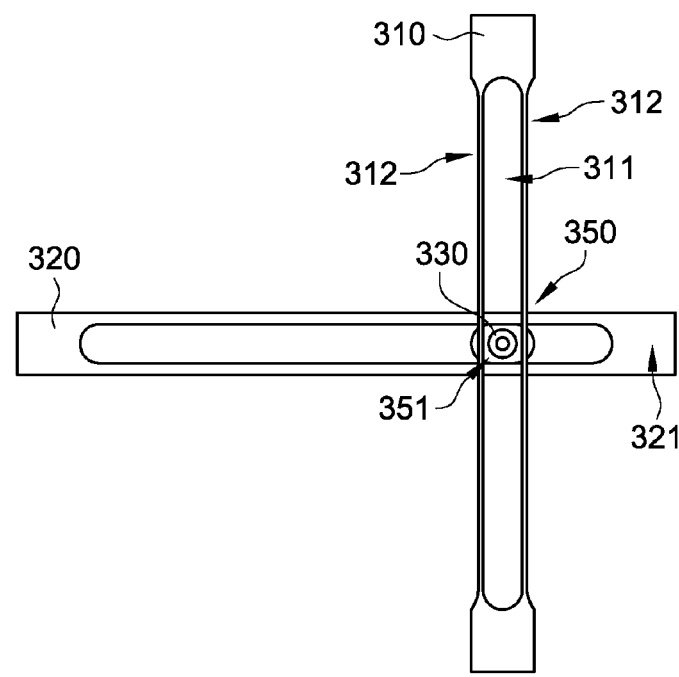
FIG. 2B to FIG. 2D is a view of the first pillar, the second pillar, and the movable element moving along the first direction and/or the second direction according to the first embodiment.
Figure 2C:
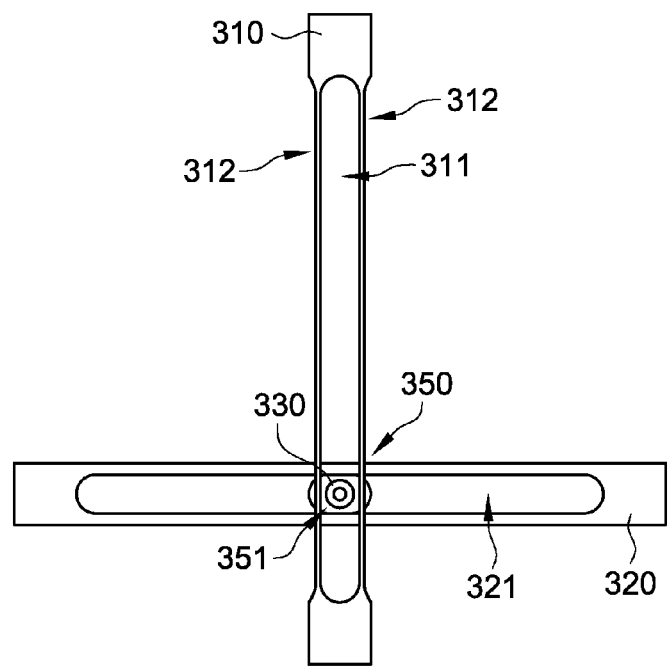
Figure 2D:
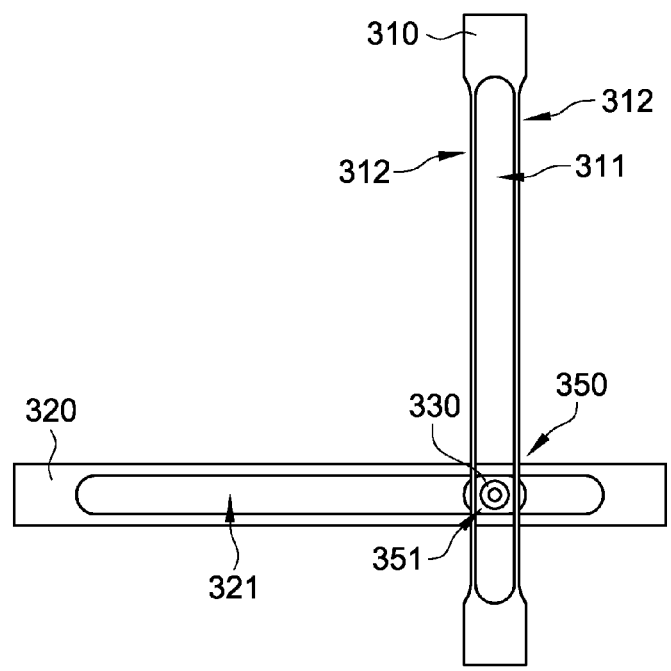
Figure 3A:
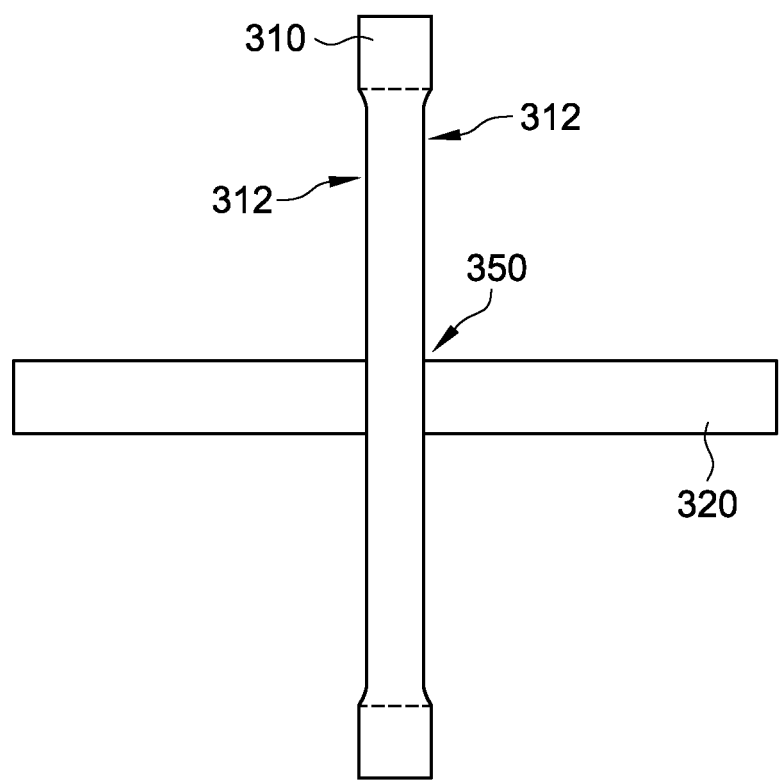
FIG. 3A is a view of the first pillar and the second pillar according to a second embodiment.
Figure 3B:
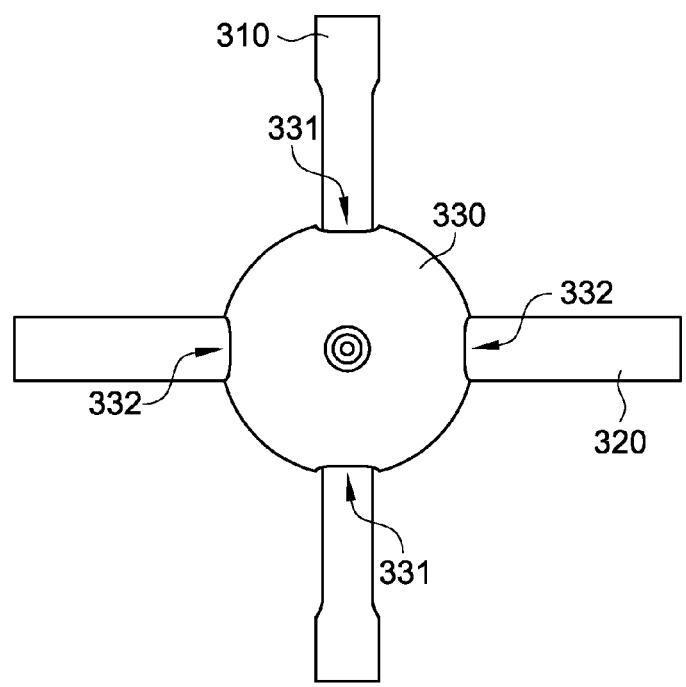
FIG. 3B is a view of the first pillar, the second pillar, and the movable element according to the second embodiment.
Figure 3C:
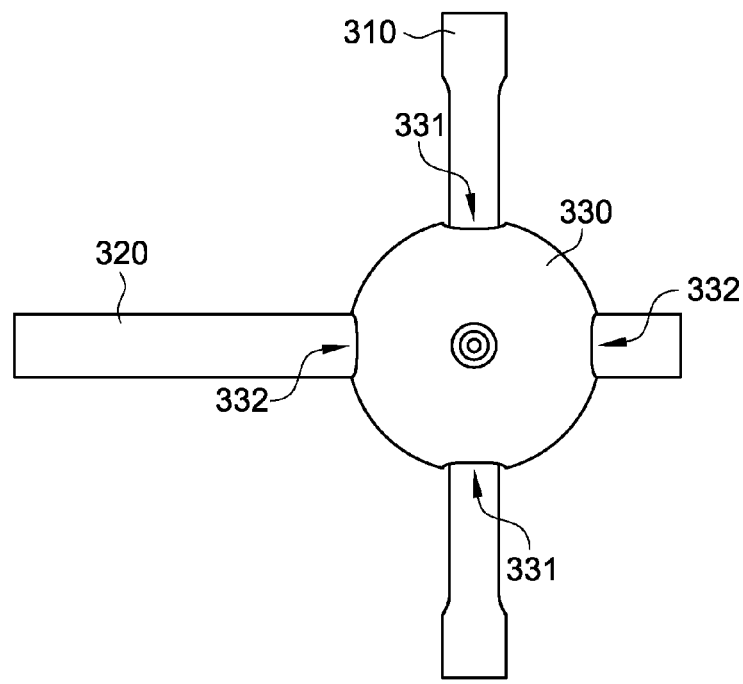
FIG. 3C to FIG. 3E is a view of the first pillar, the second pillar, and the movable element moving along the first direction and/or the second direction according to the second embodiment
Figure 3D:
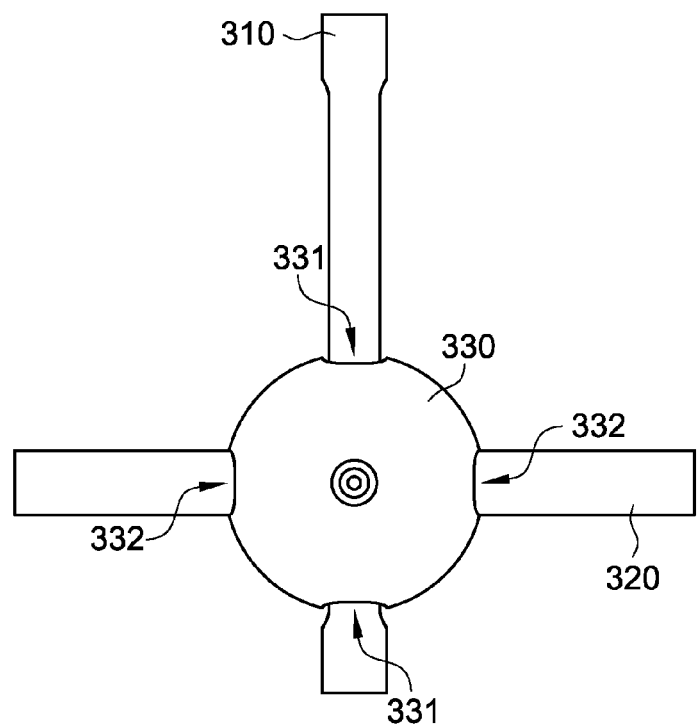
Figure 3E:
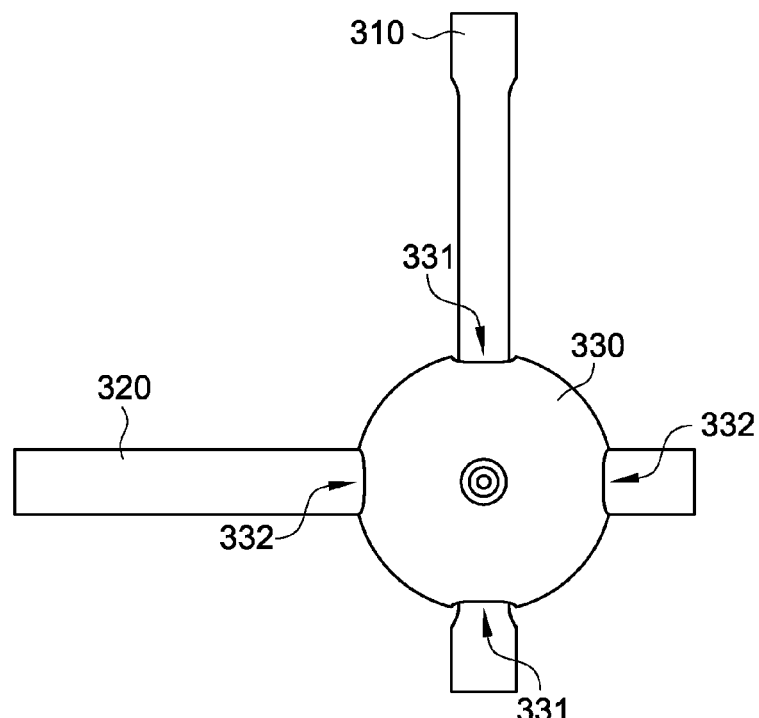

Refer to FIG. 1A and FIG. 1B, the computer case according to the first embodiment includes a housing 200 and a cooling device 300. The housing includes a top surface 210, a first side surface 220, a second side surface 230, and a bottom surface 240. The first side surface 220 and the second side surface 230 are connected with the top surface 210 and the bottom surface 240. The top surface 210 has a top guidance slot hole 211; the first side surface 220 has a first side guidance slot hole 221; the second side surface 230 has a second side guidance slot hole 231; the bottom surface 240 has a bottom guidance slot hole 241. The housing 200 further includes a third side surface 250 and a fourth side surface 260. The top surface 210, the bottom surface 240, the first side surface 220, the second side surface 230, the third side surface 250, and the fourth side surface 260 form a hexahedron structure. The top guidance slot hole 211, the first side guidance slot hole 221, the second side guidance slot hole 231, and the fourth guidance slot hole 241 are disposed to the position near the third surface 250, while other computer components such as a motherboard and a video card are disposed to the position near the fourth side surface 260.

Refer to FIG. 1A, FIG. 1B, and FIG. 2A to FIG. 2D, a cooling device 300 includes a first pillar 310, a second pillar 320, a movable element 330, and a heat-dissipating element 340. The first pillar 310 penetrates the top guidance slot hole 211 and the bottom guidance slot hole 241 and has an elongated slot hole 312 communicating two sides thereof. The second pillar 320 penetrates the first side guidance slot hole 221, the second side guidance slot hole 231, and the elongated slot hole 312 and forms an intersection portion 350 in the intersection of the first pillar 310 and the second pillar 320.

The movable element 330 is disposed in the intersection portion 350 and is combined with the first pillar 310 and the second pillar 320 in a sliding manner. The heat-dissipating element 340 is fixed to the movable element 330 and is a fan. When the first pillar 310 moves along a first direction D1 with respect to the top guidance slot hole 211 and the bottom guidance slot hole 241 and/or the second pillar 320 moves along a second direction D2 with respect to the first side guidance slot hole 221 and the second side guidance slot hole 231, the movable element 330 drives the heat-dissipating element 340 to move along the first direction D1 and/or the second direction D2, that is, users can adjust the position of the heat-dissipating element 340 on the Cartesian coordinates formed by the first direction D1 and the second direction D2.

One side of the first pillar 310 has a first groove 311 communicating the elongated slot hole 312, and one side of the second pillar 320 has a second groove 321 opening in the same direction of the first groove 311. An accommodating room 351 is formed at the intersection of the first groove 311 and the second groove 321 in the intersection portion 350, and the movable element 330 is disposed at the accommodating room 351.

The size of the movable element 330 is approximately the same as to that of the accommodating room 351, and part of the movable element 330 slightly protrudes the first groove 311 in the intersection portion 350. Specifically, the shape of the movable element 330 is approximately a ball. Because part of the movable element 330 slightly protrudes the first groove 311 in the intersection portion 350, the movable element 330 is restricted in the accommodating room 351. Therefore, when the first pillar 310 moves along a first direction D1 with respect to the top guidance slot hole 211 and the bottom guidance slot hole 241 and/or the second pillar 320 moves along a second direction D2 with respect to the first side guidance slot hole 221 and the second side guidance slot hole 231, the movable element 330 moves along the first direction D1 and/or the second direction D2 with the movement of the accommodating room 351. Meanwhile, the heat-dissipating element 340 fixed to the movable element 330 moves along the first direction D1 and/or the second direction D2 as well, so as to adjust the position of the heat-dissipating element 340.

When using the computer assembled by the computer case of this disclosure, users can use the software monitoring the temperature of the hardware as well. If finding the temperature of the central processing unit is too high, users can manually adjust the positions of the first pillar 310 and the second pillar 320, so that the heat-dissipating element 340 moves toward the central processing unit.

Refer to FIG. 3A to FIG. 3E, the computer case according to the second embodiment is similar to that according to the first embodiment. The only difference is the way the movable element 330 is disposed in the intersection portion 350. Specifically, the movable element 330 has a first perforation 331 and a second perforation 332 perpendicular to the first perforation 331, and the first perforation 331 communicates the second perforation 332. The first pillar 310 runs through the first perforation 331, and the second pillar 320 runs through the second perforation 332.

In other words, the movable element 330 is sleeved over the first pillar 310 and the second pillar 320. Therefore, when the first pillar 310 moves along the first direction D1 and/or the second pillar 320 moves along the second direction D2, the movable element 330 moves along the first direction D1 and/or the second direction D2 as well. Meanwhile, the heat-dissipating element 340 fixed to the movable element 330 moves along the first direction D1 and/or the second direction D2 as well, so as to adjust the position of the heat-dissipating element 340.

Figure 4A:
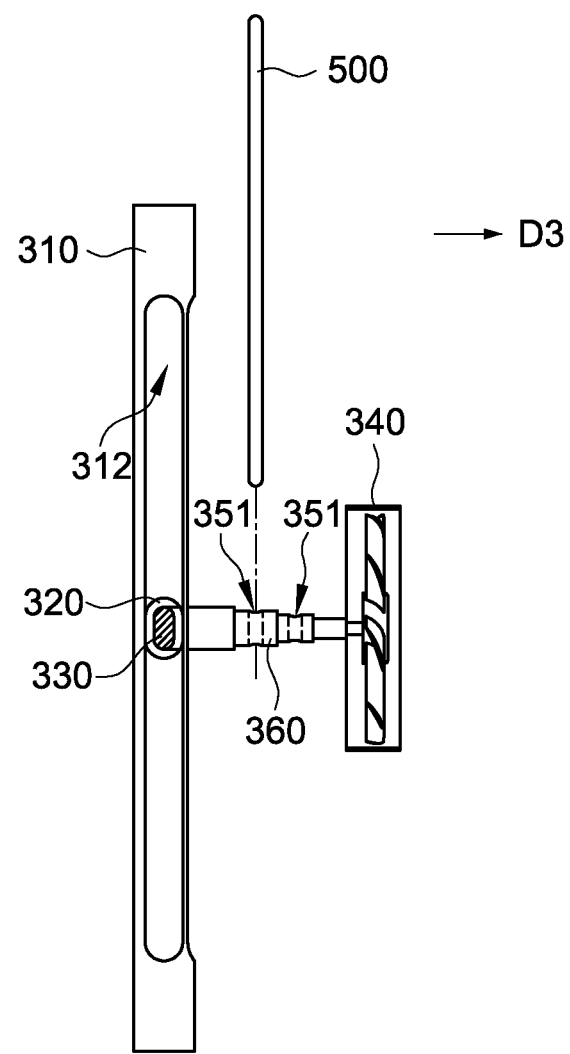
FIG. 4A is a sectional view of the cooling device according to a third embodiment.
Figure 4B:
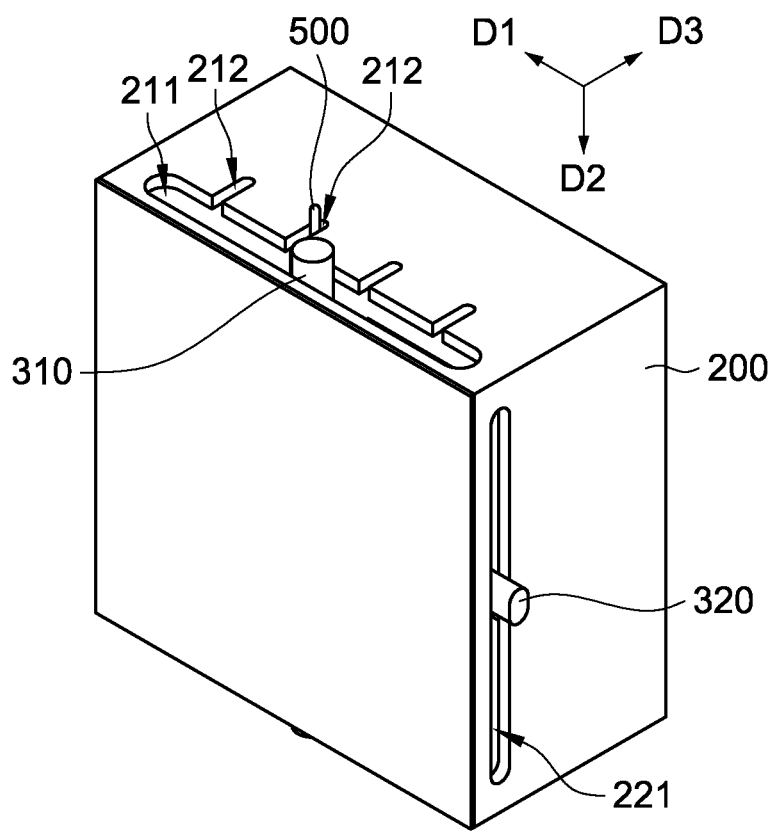
FIG. 4B is a perspective view of the computer case according to the third embodiment.

Refer to FIG. 4A and FIG. 4B, the computer case according to the third embodiment is similar to that according to the first embodiment, so the following will describe in detail only the difference of the two embodiments.

The heat-dissipating element 340 further includes a stretching portion 360, and the heat-dissipating element 340 is disposed to the stretching portion 360. When the stretching portion 360 stretches along a third direction D3 perpendicular to the first direction D1 and the second direction D2, the heat-dissipating element 340 moves along the third direction D3 as well. In other words, users can adjust the position of the heat-dissipating element 340 not only on the plane formed by the first direction D1 and the second direction D2 but also in the space formed by the first direction D1, the second direction D2, and the third direction D3.

The stretching portion 360 has a hole 352, and the top surface 210 further has one or a plurality of side top guidance slot hole 212 perpendicular to the top guidance slot hole 211. A pulling element 400 penetrates the hole 352 and the side top guidance slot hole 212. When the pulling element 400 moves along the third direction D3, the stretching portion 360 stretches along the third direction D3. In other words, users can control the stretching magnitude along the third direction D3 of the stretching portion 360 via the pulling element 400 without opening the housing 200.

It is noted that in the first to the third embodiment, the first pillar 310 protrudes in the top guidance slot hole 211 and the bottom guidance slot hole 241, and the second pillar 320 protrudes in the first side guidance slot hole 221 and the second side guidance slot hole 231. When adjusting the position of the heat-dissipating element 340, users can move the position of heat-dissipating element 340 along the first direction D1 and the second direction D2 via the parts of first pillar 310 and the second pillar 320 that protrude the housing 200 without opening the housing 200.

It is also noted that in the first to the third embodiment, the top guidance slot hole 211 is parallel to a long side of the top surface 210; the first side guidance slot hole 221 is parallel to a long side of the first side surface 220; the second side guidance slot hole 231 is parallel to a long side of the second side surface 230; the bottom guidance slot hole 241 is parallel to a long side of the bottom surface 240.

Still, it is noted that in the first to the third embodiment, the length of the top guidance slot hole 211 corresponds to the long side of the top surface 210; the length of the first side guidance slot hole 221 corresponds to the long side of the first side surface 220; the length of the second side guidance slot hole 231 corresponds to the long side of the second side surface 230; and the length of the bottom guidance slot hole 241 corresponds to the long side of the bottom surface 240.

People having ordinary skill in the art can make proper modification to the computer case and the cooling device thereof according to the actual needs or design requirements, not limited as described herein.

Via the first pillar, the second pillar, or the pulling element, the computer case and the cooling device thereof of this disclosure make users able to adjust the position of the heat-dissipating element according to cooling need without opening the housing.

Though the embodiments of this disclosure are disclosed as described above, this is not to limit this disclosure. People having ordinary skill in the art will recognize that this disclosure can be practiced with modification within the spirit and scope of the claim. It is therefore to be understood that this disclosure is not to be limited by the foregoing description but only by the appended claims.

What is claimed is:

1. A computer case, comprising:
   a housing, including a top surface, a first side surface, a second side surface, and a bottom surface, wherein the top surface has a top guidance slot hole, the first side surface has a first side guidance slot hole, the second side surface has a second side guidance slot hole, the bottom surface has a bottom guidance slot hole, and the first side surface and the second side surface are connected with the top surface and the bottom surface; and
   a cooling device, including:
      a first pillar, penetrating the top guidance slot hole and the bottom guidance slot hole and having an elongated slot hole communicating two sides of the first pillar;
      a second pillar, penetrating the first side guidance slot hole, the second side guidance slot hole, and the elongated slot hole and forming an intersection portion in the intersection of the first pillar and the second pillar;
      a movable element, disposed in the intersection portion and combined with the first pillar and the second pillar in a sliding manner; and
      a heat-dissipating element, fixed to the movable element;
   wherein when the first pillar moves along a first direction with respect to the top guidance slot hole and the bottom guidance slot hole and/or the second pillar moves along a second direction with respect to the first side guidance slot hole and the second side guidance slot hole, the movable element drives the heat-dissipating element to move along the first direction and/or the second direction.

2. The computer case as claimed in claim 1, wherein one side of the first pillar has a first groove communicating the elongated slot hole, one side of the second pillar has a second groove opening in the same direction of the first groove, an accommodating room is formed at the intersection of the first groove and the second groove in the intersection portion, and the movable element is disposed at the accommodating room.

3. The computer case as claimed in claim 1, wherein the movable element further has a first perforation and a second perforation perpendicular to the first perforation, the first perforation communicates the second perforation, the first pillar runs through the first perforation, and the second pillar runs through the second perforation.

4. The computer case as claimed in claim 1, wherein the first pillar protrudes in the top guidance slot hole and the bottom guidance slot hole, and the second pillar protrudes in the first side guidance slot hole and the second side guidance slot hole.

5. The computer case as claimed in claim 1, wherein the first direction is perpendicular to the second direction.

6. The computer case as claimed in claim 1, wherein the movable element further has a stretching portion, the heat-dissipating element is disposed to the stretching portion, and when the stretching portion stretches along a third direction perpendicular to the first direction and the second direction, the heat-dissipating element moves along the third direction.

7. The computer case as claimed in claim 6, wherein the stretching portion further has a hole, the top surface further has a side top guidance slot hole perpendicular to the top guidance slot hole, a pulling element penetrates the hole and the side top guidance slot hole, and when the pulling element moves along the third direction, the stretching portion stretches along the third direction.

8. The computer case as claimed in claim 1, wherein the top guidance slot hole is parallel to a long side of the top surface, the first side guidance slot hole is parallel to a long side of the first side surface, the second side guidance slot hole is parallel to a long side of the second side surface, and the bottom guidance slot hole is parallel to a long side of the bottom surface.

9. The computer case as claimed in claim 1, wherein the length of the top guidance slot hole corresponds to a long side of the top surface, the length of the first side guidance slot hole corresponds to a long side of the first side surface, the length of the second side guidance slot hole corresponds to a long side of the second side surface, and the length of the bottom guidance slot hole corresponds to a long side of the bottom surface.

10. A cooling device, applying to penetrate a housing, wherein the housing includes a top surface, a first side surface, a second side surface, and a bottom surface, the top surface has a top guidance slot hole, the first side surface has a first side guidance slot hole, the second side surface has a second side guidance slot hole, the bottom surface has a bottom guidance slot hole, and the first side surface and the second side surface are connected with the top surface and the bottom surface, comprising:
   a first pillar, penetrating the top guidance slot hole and the bottom guidance slot hole of the housing and including an elongated slot hole communicating two sides of the first pillar;
   a second pillar, penetrating the first side guidance slot hole and the second side guidance slot hole of the housing and the elongated slot hole in the first pillar and forming an intersection portion in the intersection of the first pillar and the second pillar;
   a movable element, disposed in the intersection portion and combined with the first pillar and the second pillar in a sliding manner; and
   a heat-dissipating element, fixed to the movable element;
   wherein when the first pillar moves along a first direction with respect to the top guidance slot hole and the bottom guidance slot hole and/or the second pillar moves along a second direction with respect to the first side guidance slot hole and the second side guidance slot hole, the movable element drives the heat-dissipating element to move along the first direction and/or the second direction.

* * * * *